United States Patent [19]

Sher

[11] 4,058,729

[45] Nov. 15, 1977

[54] PYROELECTRIC APPARATUS INCLUDING EFFECTIVELY INTRINSIC SEMICONDUCTOR FOR CONVERTING RADIANT ENERGY INTO ELECTRIC ENERGY

[76] Inventor: Arden Sher, 108 Charles River Landing Road, Williamsburg, Va. 23185

[21] Appl. No.: 710,296

[22] Filed: July 30, 1976

Related U.S. Application Data

[63] Continuation-in-part of Ser. No. 632,090, Nov. 14, 1975, abandoned.

[51] Int. Cl.² .............................................. G01T 1/24
[52] U.S. Cl. .................................... 250/370; 250/336; 250/338
[58] Field of Search ................ 250/336, 338, 370, 371

[56] References Cited

U.S. PATENT DOCUMENTS

| 3,450,879 | 6/1969 | Seppi ................................. 250/370 X |
| 3,851,174 | 11/1974 | Tynan et al. ......................... 250/336 |
| 3,932,753 | 1/1976 | Stotlar ............................... 250/370 X |
| 3,949,210 | 4/1976 | Eichinger et al. .................... 250/370 |
| 3,985,685 | 10/1976 | Houlton et al. .................. 250/370 X |

Primary Examiner—Archie R. Borchelt
Attorney, Agent, or Firm—Lowe, King, Price & Markva

[57] ABSTRACT

Radiant energy is converted into electric energy by irradiating a capacitor including a layer of an intrinsic or lightly doped semiconductor, having opposite faces on which first and second insulating layers are respectively provided. First and second metallic contacts are respectively provided on the first and second insulating layers. The radiant energy cyclically heats the dielectric to cause cyclic changes in the capacitance and resistance of the capacitor. The capacitor is initially charged to a voltage just below the breakdown voltage of the insulating and semiconductor layers by temporarily connecting it across a D.C. source to cause a current to flow through a charging resistor to the capacitor. The device can be utilized as a radiant energy detector, as well as a solar energy cell.

30 Claims, 4 Drawing Figures

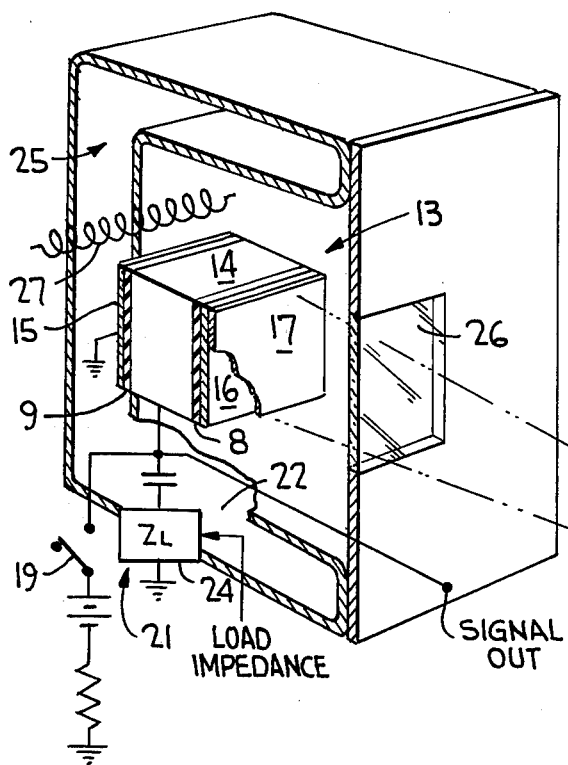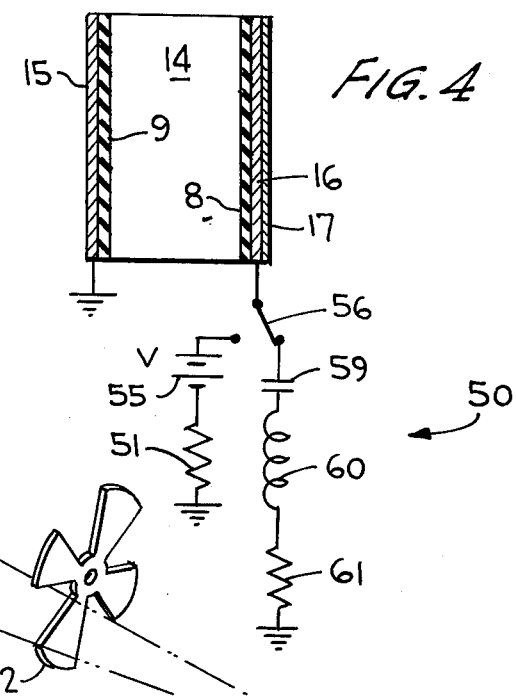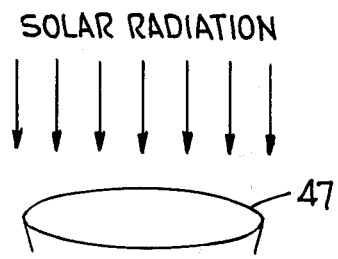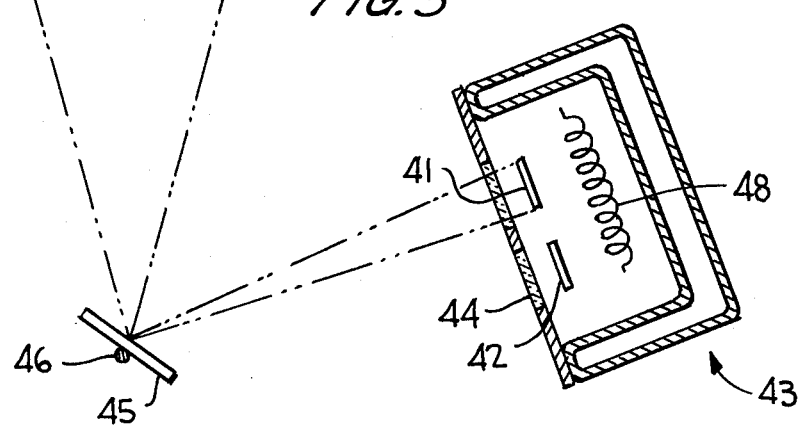

PYROELECTRIC APPARATUS INCLUDING EFFECTIVELY INTRINSIC SEMICONDUCTOR FOR CONVERTING RADIANT ENERGY INTO ELECTRIC ENERGY

RELATIONSHIP TO OTHER APPLICATION

The present application is a continuation-in-part of my co-pending application, Ser. No. 632,090 filed Nov. 14, 1975, now abandoned.

FIELD OF INVENTION

The present invention relates generally to pyroelectric apparatus for converting radiant energy into electric energy and particularly to a pyroelectric apparatus including a capacitor having an intrinsic or lightly doped semiconductor layer and an insulating layer on the semiconductor layer.

BACKGROUND OF THE INVENTION

Devices for converting radiant energy, such as optical energy, into electric energy presently generally take two forms, viz.: (1) semiconductors relying upon a barrier layer mechanism, and (2) pyroelectric devices wherein a ferroelectric is cyclically heated and cooled to provide corresponding changes in the capacitance and resistance of a capacitor including the ferroelectric.

Typically, the barrier layer semiconductor devices have relatively heavy doped semiconductor layers with energy gaps that, in essence, absorb certain wavelengths of interest and convert the energy of the absorbed wavelengths into electric energy. These devices are utilized as radiant, optical energy detectors for specific wavelengths of interest, as well as power generating solar cells. The major disadvantage of the semiconductor devices as radiant energy detectors is that the semiconductor element must usually be maintained at cryogenic temperatures to function effectively. It is frequently difficult to maintain a semiconductor device at a cryogenic temperature, whereby the usefulness of semiconductor radiant energy detectors is often limited. The major disadvantage of the semiconductor devices as solar energy converters is that such devices are relatively inefficient in converting the solar energy into electrical energy. The typical, actual maximum efficiency of such converters is generally on the order of 10%.

Pyroelectric devices are generally characterized by a ferroelectric dielectric that is positioned between a pair of electrodes to form a capacitor responsive to the optical energy. Typically, the ferroelectric material is periodically heated and cooled to cause a periodic variation in the capacitance and resistance of the capacitor. Since the ferroelectric materials have dipole layers extending completely through the dielectric, i.e., from one electrode to the other electrode, the dielectrics are strongly piezoelectric, making them sensitive to vibrations. Thereby, the pyroelectric detectors have a tendency to be noisy and frequently have relatively low signal to noise ratio outputs. In addition, the pyroelectric detectors often have detectivities below the level of the radiation impinging on the dielectric, thereby limiting their application in many systems.

In my copending application entitled "Apparatus For Converting Radiant Energy Into Electric Energy", Ser. No. 631,689, filed Nov. 13, 1975, there is disclosed an improved radiant energy detector and solar energy converter having higher detectivity and sensitivity than prior art detectors and greater efficiency than prior art energy converters. In the device disclosed in my copending application, a capacitor includes an ionic dielectric having a dipole layer only on or near the dielectric surface. The dielectric is generally selected from the group consisting of the rare earth trifluorides and trichlorides, and is preferably lanthanum trifluoride. A possible problem with the use of this class of materials is that it has relatively low breakdown voltages, on the order of 5 to 10 volts, regardless of the thickness of the dielectric layer; the breakdown voltage is dependent exclusively upon the dielectric material. A further possible disadvantage of the device disclosed in the copending application may be the difficulty of obtaining the specified rare earth trifluorides and trichlorides.

BRIEF DESCRIPTION OF THE INVENTION

In accordance with the present invention, a device for converting radiant energy into electric energy includes a capacitor responsive to the radiant energy, wherein the capacitor comprises a layer of an intrinsic or lightly doped semiconductor and at least one and preferably two insulating layers on the semiconductor layer. If the semiconductor is lightly doped, to increase the breakdown voltage of the capacitor, the doping is light enough that the semiconductor layer still functions effectively as an intrinsic layer; hence, the term "effectively intrinsic semiconductor layer" as used in the present specification and claims refers to a layer having resistance and capacitance that vary exponentially, as a function of temperature, in the same manner as an intrinsic layer. Intrinsic semiconductor layers, e.g., of germanium or silicon, with deep doped donors or acceptors, to a concentration of approximately $10^{17}$ to $10^{18}$ per cm$^3$, or with shallow doped donors to a concentration of approximately $10^{13}$ to $10^{14}$ per cm$^3$ are considered to be effectively intrinsic semiconductor layers. (Shallow donors or acceptors, by definition, are impurities having ionization energies small enough so they are completely ionized at room temperature. Thus for them there is a one-to-one correspondence between the impurity concentration and the carrier concentration. However, deep donors and acceptors, by definition, are not completely ionized at room temperature, so for them there is not a one-to-one correspondence with the carrier concentration.) The device is provided with a pair of contacts that are preferably formed as metallic contacts on the first and second insulating layers. There are no junction-type barrier layers in the semiconductor layer or between the insulating layers and the metal contacts; the only barrier layers reside at the interfaces between the semiconductor and the insulating layers. Such a configuration has an equivalent circuit including a pair of series capacitors having values commensurate with the capacitance of each of the insulating layers, a series resistor having a value equal to the semiconductor resistance, and a further pair of series capacitors having values equal to the capacitance of a pair of depletion and accumulation layers of the intrinsic semiconductor. In a case (Case I), corresponding to a low charging voltage, for a specified ambient temperature, three cases can be distinguished as a function of charging voltage applied between the contacts. The depletion and accumulation layers have effective thicknesses equal to the Debye shielding length of the semiconductors at each of its intersections with the insulating layers. In a second case (Case II), the voltage is large enough to form a depletion layer having a thickness exceeding the Debye shielding length and substantially smaller than the semiconductor thickness. For the third case (Case III), the voltage is so large that the depletion layer occupies practically the whole semiconductor thickness. The preferred operating conditions correspond to Cases I or II.

Preferably, the device of the present invention utilizes any of the well known, and generally available, intrinsic semiconductors, such as silicon, germanium, gallium arsenide, diamond, silicon carbide and gallium phosphide; also, the insulating layers are preferably formed as oxides of the intrinsic semiconductor. The intrinsic semiconductors can be charged to relatively large voltages, on the order of 30 volts, without breaking down while still operating in Cases I and II defined earlier. Thereby, the devices of the present invention can be initially charged to a higher voltage level than the devices described in my copending application, thereby possibly providing greater detectivity with the device of the present invention than the device disclosed in the prior patent application. By utilizing lightly doped semiconductors, as described supra, the initial charging voltage can be increased further without causing breakdown of the semiconductor layer.

The resistance and capacitance of the intrinsic or lightly doped semiconductors vary in an exponential manner for Cases I and II in accordance with:

$$C = C_o e^{-E_c/kT} \quad (1)$$

$$R = R_o e^{E_r/kT} \quad (2)$$

where:

$C_o$ = static capacitance of the capacitor at high temperature, i.e., $kT >> E$, $R_o$ = the static, series resistance of the capacitance at high temperature, i.e., $kT >> E$, $E_c$ = the activation energy for the temperature dependent capacitance of the capacitor, $E_r$ = the activation energy of the temperature dependent resistance of the capacitor, $k$ = Boltzmann's constant, and $T$ = temperature in degrees Kelvin. Hence, by cyclically increasing and decreasing the temperature of the dielectric, by chopping radiation from a source of interest or solar radiation, the capacitance of the dielectric respectively increases and decreases, while the resistance of the dielectric respectively decreases and increases.

It is, accordingly, an object of the present invention to provide a new and improved pyrolectric device for converting radiant energy into electric energy.

Another object of the invention is to provide a new and improved solar energy converter.

A further object of the invention is to provide a new and improved pyrolectric radiation to electric energy converter wherein the converter is capable of supplying increased voltage to a load.

Yet another object of the invention is to provide a new and improved pyroelectric radiant energy to electric energy converter wherein the device includes a dielectric that can be charged to a relatively high, initial voltage.

Still another object of the invention is to provide a new and improved pyroelectric radiant energy to electric energy converter employing generally available intrinsic or lightly doped semiconductors.

The above and still further objects, features and advantages of the present invention will become apparent upon consideration of the following detailed description of several specific embodiments thereof, especially when taken in conjunction with the accompanying drawing.

BRIEF DESCRIPTION OF THE DRAWING

FIG. 1 is a partially schematic and partially perspective view of one embodiment of the present invention;

FIG. 2 is an equivalent circuit diagram of the apparatus illustrated in FIG. 1;

FIG. 3 is a partially schematic and partially perspective view of the invention as employed as a solar energy converter; and FIG. 4 is a schematic diagram of one solar energy converter cell and its load.

DETAILED DESCRIPTION OF THE DRAWING

Reference is now made to FIG. 1 of the drawing wherein radiant energy from a suitable source 11, which may have a wavelength anywhere from the ultraviolet to microwave frequencies, is cyclically interrupted by chopper 12 so that the energy illuminates pyroelectric detector 13. In the preferred embodiment, source 11 is in the infrared range and chopper 12 is rotated at a constant rate so that radiation from source 11 impinges on the detector at a predetermined, constant frequency. Detector 13 is effectively a variable capacitor including a solid, intrinsic or lightly doped semiconductor layer 14 having opposed faces on which are formed relatively thin electrically insulating layers 8 and 9. On layers 8 and 9 are metallic contacts that form electrodes 15 and 16 of the variable capacitor. On electrode 16 which faces source 11, there is a thin radiation absorbing layer 17 that absorbs a wavelength or spectrum of interest from source 11 to periodically heat the effectively intrinsic semiconductor layer 14. Layer 14 is cooled by the ambient atmosphere while chopper 12 blocks detector 13 so that the layer is alternately, periodically heated and cooled at a frequency determined by the rotation rate of the chopper.

Preferably, insulating layers 8 and 9 are relatively thin oxide layers of the semiconductor layer 14, which oxide layers are formed by firing the opposed faces of the semiconductor layer. Metallic contacts 15 and 16 are also relatively thin, typically being formed by vacuum vapor depositing silver or gold on the oxide layers. Hence, the preferred configuration may be termed a metal-oxide effectively intrinsic semiconductor-oxide-metal device. In one embodiment, oxide layers 8 and 9 are approximately 200 Angstroms thick, while each of electrodes 15 and 16 has a thickness on the order of between 0.1 to 0.5 microns. Electrode 16 and layer 9 must be thin enough and formed of materials to enable temperature variations of absorbing layer 17 to be coupled, virtually without attenuation, to the face of semiconductor layer 14 on which layer 16 is formed. Thereby, the cyclic heating and cooling of layer 17 in response to the chopped illumination from source 11 results in corresponding heating and cooling of semiconductor layer 14 to vary the capacitance and resistance of the semiconductor in accordance with Equations (1) and (2). Typically, the thickness of semiconductor layer 14 is on the order of 20 microns.

Prior to the device being put into operation, a charge is established between electrodes 15 and 16 across layers 8, 9 and 14. To this end, electrode 16 is initially connected to D.C. source 18 through switch 19 and current limiting resistor 20. The circuit is completed by connecting source 18 and resistor 20 to ground, as well as by connecting electrode 15 to ground. The voltage of source 18 is selected such that there is no breakdown of the semiconductor layer 14 and the depletion layer thickness is smaller than the semiconductor thickness when the voltage is applied between electrodes 15 and 16. It is desirable to provide as high an initial voltage as possible between electrodes 15 and 16, without achieving breakdown so that a substantial current can be derived from detector 13 in response to the periodic heating and cooling of semiconductor layer 14 resulting from the chopping of radiation from source 11. In a typical configuration, where layer 14 is intrinsic silicon having a thickness of 20 microns, the voltage applied by source 18 to electrodes 15 and 16 is approximately 20 volts.

After the initial voltage has been applied across semiconductor layer 14 and insulating layers 8 and 9 by D.C. source 18, switch 19 is opened and current is supplied by detector 13 to an external load circuit 21 in response to the alternate heating and cooling of the semiconductor layer. Load circuit 21 includes a relatively large blocking capacitor 23, connected in series between electrode 16 and resistive load impedance 24, to prevent discharge of detector 13. Load impedance 24 is series connected to electrode 15 via a ground connection and has a relatively large, resistive value so that maximum voltage can be developed across it and applied to input terminals of an A.C. amplifier (not shown) that drives a synchronous detector (not shown) responsive to the frequency of the chopped radiation from source 11.

In response to the alternate heating and cooling of semiconductor layer 14 in response to the chopped radiation from source 11 impinging on layer 17, the capacitance and resistance of the semiconductor are varied as given supra by Equations (1) and (2); Equations (1) and (2) are applicable to intrinsic or lightly doped semiconductor layers, i.e., effectively intrinsic layers, but not to more heavily doped semiconductor layers, wherein the increased concentration of charged particles causes the temperature impedance relationship of a semiconductor layer to differ than Equations (1) and (2). From Equation (2), it is seen that the resistance of detector 13 decreases with increasing temperature. Therefore, it is desirable to raise the ambient temperature of detector 13 to provide maximum detectivity and sensitivity. An ambient temperature of detector 13 of approximately 400°-500° K enables the detector to function in an optimum manner.

To enable the device to be maintained at an ambient temperature of between 400°-500° K. and maximize the thermal time constant of the device, detector 13 is placed in an evacuated Dewar 25 having a window 26 transparent to the radiant energy of source 11 or of the wavelength desired to be detected. Within Dewar 25 there is provided an electric heater 27 to maintain detector 13 at the desired temperature.

FIG. 2 is an illustration of an equivalent circuit diagram for the device illustrated in FIG. 1. In the circuit of FIG. 2, detector 13 is represented by series, fixed capacitors 31 and 32, which respectively represent the capacitance of insulating layers 8 and 9. Connected in series with capacitors 31 and 32 are variable capacitors 33 and 34, which respectively represent depletion or accumulation layers of the semiconductor layer 14 on which insulating layers 8 and 9 are formed. Variable resistor 35 represents the resistance of semiconductor layer 14. In response to the cyclic heating and cooling of semiconductor layer 14, the Debye shielding lengths of the depletion layers represented by capacitors 33 and 34 are respectively decreased and increased, resulting in increased and decreased values of the capacitors, while the resistance value of resistor 35 is decreased and increased. The capacitances of the depletion or accumulation layers represented by variable capacitors 33 and 34 are the capacitances of effective insulating layers of the semiconductor adjacent insulating layers 18 and 19. The device is preferably configured so that the Debye shielding length is much greater than the thickness of insulating layers 31 and 32, whereby the capacitance ($C_D$) value of each of capacitors 33 and 34 is much much less than the capacitance ($C_I$) of each of insulating layers 8 and 9. In such an event, the total series capacitance of detector 13, C, is approximately $C_D/2$. The Debye length, $L_D$, associated with each of capacitors 33 and 34 is inversely proportional to the square root of the carrier concentration, $n$, of the depletion or accumulation layers of the semiconductor layer 14, whereby, for an intrinsic semiconductor:

$$L_D = ( \frac{\epsilon k T}{4\pi e^2 n} )^{\frac{1}{2}} \qquad (3)$$

where:
$\epsilon$ = the dielectric constant of layer 14,
$k$ = Boltzmann's constant,
$T$ = temperature, in degrees Kelvin,
$e$ = the charge on an electron, and
$n$ = the carrier concentration.

The thickness of the depletion layer, $L_d$, is approximately equal to $$L_d = ( \frac{\epsilon V}{2 e n} )^{\frac{1}{2}} \qquad (4)$$

provided that V is small enough so that $L_d < L$, the total thickness of the semiconductor layer. The capacitance $C_D$ is approximately $C_D = \epsilon A/L_D$ if $L_D > L_d$ and $C_D = \epsilon A/L_d$ if $L_D < L_d$. In either case, $C_D$ varies proportionally to $n^{\frac{1}{2}}$. The carrier concentration, $n$, is exponentially related to the temperature of layer 14, in accordance with:

$$n = K_1 e^{-\frac{E_G}{2kT}} \qquad (5)$$

where:
$K_1$ = a predetermined constant, and
$E_G$ = the gap energy of the intrinsic semiconductor layer 14.

Since the capacitance of layer 14 is related to the square root of the carrier concentration $n$, it is seen that the capacitance of device 13 is exponentially related to temperature, as given by Equation (1) with $E_c = E_G/4$.

For an ambient temperature of detector 13 of 500° Kelvin, and an intrinsic semiconductor layer 14 of silicon having a dielectric constant of 11.7, a thickness L = 20 × $10^{31~4}$cm, the carrier concentration, $n$, equals 2 × $10^{14}$cm$^{-3}$, the Debye length, $L_D$, equals 4.1 × $10^{-5}$cm, and for V = 20 volts, $L_d$ = 15 × $10^{-4}$cm. Detector 13 can be charged to 20 volts without danger of breakdown since the breakdown field of silicon is approximately 2 × $10^5$ volts per centimeter.

It can be shown that the detectivity, $D^*$, of the detector unit illustrated in FIG. 1 and including an intrinsic semiconductor layer 14 is represented by:

$$D^* = \frac{\eta E V}{2 C_V^{1.5} T^{2.5} L^{1.5} \omega \rho^{0.5}} \quad (6)$$

where:

$\eta =$ the efficiency of the unit in converting thermal energy incident on layer 17 into thermal variations of semiconductor layer 14, assumed to be 1, $E =$ the activation energy of semiconductor layer 14 ($E = E_G/4$), $C_V =$ the heat capacity per unit volume of semiconductor layer 14, $L =$ the thickness of semiconductor layer 14, $V =$ the voltage initially applied to detector 13 by D.C. source 18, $\omega =$ angular frequency of radiation from source 12 illuminating detector 13, $\rho =$ the resistivity By assuming that: detector 13 is maintained at an ambient temperature of 500° K., intrinsic semiconductor layer 14 has a resistivity of 50 ohm centimeters, $C_V = 2$ Joules per cubic centimeter degrees Kelvin, $V = 20$ volts, $L = 20$ microns, $\omega = 2\pi f = 60$ seconds$^{-1}$, $\eta = 1$, and $E = 0.25$eV, the detectivity of the cell illustrated in FIG. 1 is approximately $2 \times 10^{10}$ watts $^{-1}$ Hertz $^{\frac{1}{2}}$ cm. To provide maximum detectivity, assuming that lattice scattering dominates charge mobility of layer 14, it is desirable to employ an intrinsic semiconductor having an energy gap and operating temperature that satisfy the condition $E_g = 7kT$. For intrinsic Si the temperature used in the example above falls below the value needed to satisfy the optimum condition.

Detectors utilizing intrinsic semiconductor layers and performing in accordance with Equation (6) function best when they are as thin as possible. Assuming that the depletion layer, $L_d$, is thin compared to the total semiconductor thickness, $L$, $D^* \doteq (V/_L 1.5)$. However, for a detector employing an intrinsic semiconductor layer that functions near room temperature this places a serious restriction on the size of $V$ and therefore on the $D^*$ value. This problem can be circumvented by forming semiconductor layer 14 to have any one of the following three properties, viz.:

1. Use a very narrow gap intrinsic material;
2. Dope an intrinsic semiconductor, e.g., Ge or Si, with deep donors or acceptors to a concentration of about $10^{17}$ or $10^{18}$ cm$^{-3}$; or
3. An intrinsic semiconductor, e.g., Dope Ge or si, with shallow donors to a concentration of about $10^{13}$ or $10^{14}$ cm$^{-3}$.

In (1) and (2), the low voltage difficulty is circumvented because the activation energy, $E$, of the semiconductor layer is effectively reduced to a point, where at room temperature, there are enough carriers to enable the initial voltage, $V$, to be made large enough to be useful.

To analyze (3) assume that donors are placed in an intrinsic Ge layer so that the total carrier concentration is:

$$n = n^* + n_i$$

where:

$n^*$ is the donor concentration, and $n_i$ is the concentration of intrinsic electrons.

As the temperature varies, $n_i$ changes, but $n^*$ does not. This introduces a modification into Equation (6) to yield a new detectivity, $D^*_{n^*}$, that is related to the previous detectivity, $D^*$, by:

$$D^*_{n^*} \doteq D^* \frac{n_i}{n^*} \quad (7)$$

providing that $n^* >> n_i$, i.e., $n^* > 10 n_i$. The donor concentration, $n^*$, of approximately $10^{13}$ or $10^{14}$ electrons per cm$^3$ is large enough to enable $V$ to be raised to just below the breakdown voltage of the semiconductor material while still keeping the depletion layer thickness, $L_d$, smaller than the thickness of the semiconductor layer, $L$. This leads to the approximate condition $$V \doteq \epsilon_B L \doteq \frac{1}{4} \frac{en^*}{\epsilon} L^2$$

or $$L \doteq \frac{4\epsilon_B \epsilon}{en^*} \quad (8)$$

where: $\epsilon_B$ is the breakdown field. Equation (8) is a relation between $n^*$ and $L$. When equation (8) is substituted into the Equations (6) and (7) the expression for $D^*_{n^*}$ becomes $$D^*_{n^*} \doteq \frac{\eta_e k \epsilon_B^{\frac{1}{2}} n_i \mu_o^{\frac{1}{2}}}{4 C_V^o E^{\frac{1}{2}} \epsilon^{\frac{1}{2}} \omega} \beta^{\frac{13}{4}} e^{-2\beta} \quad (9)$$

where:

$n_i = n_0 \beta^{-3/2} e^{-2\beta}$ $C_V = C_V^o \beta^{-1}$ $\mu = \mu_o \beta^{5/2}$ (mobility)

$\beta = E/kT$ $E = E_g/4$

Equation (9) has the interesting feature that it is independent of donor concentration $n^*$. Note that $D^*_{n^*}$ is maximized by the choice $\beta = 13/8$ or $Eg = 13/2 \, kT$. At room temperature one wants $Eg = 0.16$ eV, which is fairly small but several semiconducting materials have band gaps around this value. If all the numbers appropriate for Ge[3] at room temperature are substituted into Equation (9) one finds $0D^*_{n^*} \doteq 6 \times 10^9 W^{-1}$ — cm — Hz$^{\frac{1}{2}}$, which is within an order of magnitude of the intrinsic silicon detectivity at an elevated ambient temperature. For a material, e.g., PbSe, PbTe, InSb, with an optimum band gap, $D^*_{n^*} \doteq 10^{13} w^{-1}$ — cm — Hz$^{\frac{1}{2}}$. While this last number is impressive for a room temperature detector, it is also probably unreachable because it is unlikely that amplifiers can be built with low enough noise figures, whereby the system noise would be dominated by Johnson noise in the device. The realizable limit is approximately $10^{11} w^{-1}$ — cm Hz$^{\frac{1}{2}}$, for PbS semiconductor layers 14 doped to a concentration of approximately $10^{14}$ carriers per cm$^3$.

A similar, but more approximate, result can be achieved from Equation (7) and the fact that the depletion layer thickness, $_d$, is proportional to $(V/_n^*)^{\frac{1}{2}}$ if $n^* >> n_L$ and by arranging the depletion layer thickness to be less than the semiconductor thickness, i.e., $L_d > L$. Thus, increasing $n^*$ enables $V$ to be increased, provided $n^*$ is kept low enough to enable the semiconductor capacitance and resistance to vary in accordance with Equations (1) and (2). The largest $V$ that can be used is that for which the breakdown electric field is reached in the depletion layer. From Equation (7) and the above, $$D^*_{n^*} \doteq V/n^*$$

Thus for maximum detectivity, the donor concentration is selected to maximize $V/n^*$. For all $n^* >> n_i V \doteq n^*$, so $D^*_{n^*}$ is maximized and is independent of $n^*$.

The metal-oxide-effectively intrinsic semiconductor-oxide-metal pyroelectric device of the present invention can also be employed as a solar energy converter cell. Such a converter preferably employs a load circuit resonant to the illumination frequency of the cell by radiation from a solar source. The converter preferably includes an array of cells, each of which is illuminated with different phases so that at least one of the cells in the array is illuminated at all times, to provide maximum efficiency.

One configuration for efficiently converting solar energy to electric energy is illustrated in FIG. 3 wherein solar energy alternately illuminates an array including a pair of pyroelectric cells 41 and 42, of the type discussed supra, so that the cells are alternately heated and cooled at phases displaced from each other by 180°. To achieve the alternate illumination of cells 41 and 42, the cells are mounted in side-by-side position in evacuated Dewar 43, heated to an ambient temperature of about 400° K by heater 48. Cells 41 and 42 are illuminated at phases displaced by 180° through window 44 by solar energy reflected from oscillating mirror 45 that periodically wobbles, at frequency $f$, about pivot point 46 in response to being driven by a motor (not shown). Mirror 45 is positioned to be responsive to solar radiation focused on it by collecting lens 47, that is in turn positioned to be responsive to radiation from the sun. In response to the alternate heating and cooling of cells 41 and 42 by the solar radiation reflected from mirror 45, the resistance and capacitance of cells 41 and 42 are correspondingly modulated to deliver power to a pair of load circuits, one of which is provided for each of the cells. Power derived from the load circuits can be summed together utilizing conventional transformer circuitry.

To achieve maximum transfer of current from cells 41 and 42, the cells are preferably connected to a matched load impedance through a resonant circuit. A preferred configuration for initially charging one of the cells, cell 41, and for supplying power from the cell to the matched load circuit is illustrated in FIG. 4. Cell 41 is initially charged to the voltage of D.C. source 55 by a circuit provided through double pole, single throw switch 56 and current limiting resistor 57. The voltage of D.C. source 55 is selected in accordance with the same criterion mentioned above with regard to the selection of the voltage of source 18 in FIG. 1.

After a charge has been applied by the voltage of source 55 to cell 41, switch 56 is activated to disconnect source 55 from cell 41 and to connect load circuit 58 in series with the cell. Load circuit 58 includes a D.C. blocking capacitor 59 that prevents the charge on cell 41 from discharging into the remainder of the load circuit which consists of a series inductance 60 and resistive load impedance 61. Blocking capacitor 59 has a value, $C_L$, much larger than the static capacitance, $C_o$, of cell 41 at the ambient temperature in Dewar 43, while inductor 60 is selected to have an inductance, L, necessary to resonate the series circuit at the illumination frequency of cell 41, for the static capacitance of the cell. In particular, the value of inductance 60 is selected in accordance with:

$$L = \frac{C^o + C_L}{\omega^2 C^o C_L} \qquad (10)$$

which is approximately equal to $(1/\omega^2 C^o)$, where:

$\omega = 2\pi f$, and $f =$ the oscillation frequency of mirror 45.

To achieve maximum power transfer to load impedance 61, cell 41 is matched to the load circuit, whereby the static resistance, $R_0$, of cell 41, i.e., the resistance of the cell at the ambient temperature of Dewar 43, equals the resistance of conductor 50 and the resistive value of impedance 61.

While there has been described and illustrated several specific embodiments of the invention, it will be clear that variations in the details of the embodiments specifically illustrated and described may be made without departing from the true spirit and scope of the invention as defined in the appended claims. For example, operational amplifiers, as described in my previously mentioned copending application, Ser. No. 631,689, can be used in lieu of an inductance to provide the resonating impedance for the circuit of FIG. 4. Also, it is possible to mount an array of power converting cells in a housing including reflecting walls so that virtually all of the solar energy coupled into the housing is ultimately absorbed by the radiation responsive faces of a pyroelectric device.

What is claimed is:

1. A device for converting radiant energy into electric energy comprising a capacitor responsive to the radiant energy, said capacitor comprising a layer of an intrinsic semiconductor, first and second insulating layers on the semiconductor layer, first and second metallic contacts respectively on the first and second insulating layers, said contacts, semiconductor layer and insulating layers being such that no junction barrier exists between the contacts; means responsive to the radiant energy for heating the semiconductor to modulate the capacitance between the contacts, and means for connecting a load to be responsive to current derived from the capacitor in response to the capacitance modulation.

2. The device of claim 1 further including means for initially applying a voltage between said contacts so that electric fields are established across said insulating layers and depletion layers are established in said semiconductor layer in proximity to surfaces of the semiconductor layer abutting the insulating layers.

3. The device of claim 1 wherein the means for heating includes means responsive to the radiant energy for cyclically heating and cooling the capacitor.

4. The device of claim 3 wherein the means for cyclically heating and cooling causes the dielectric to be periodically heated and cooled at a predetermined frequency, and the means for connecting includes means for resonating said capacitor to said frequency.

5. The device of claim 4 wherein the capacitor has a predetermined series, static resistance, and said load has an impedance value approximately equal to the static resistance.

6. The apparatus of claim 1 further including a layer for absorbing the radiant energy, said layer being on an exterior surface of one of the contacts.

7. The device of claim 1 further including heater means for raising the ambient temperature of the capacitor.

8. The device of claim 1 wherein the insulating layers are oxides of the semiconductor.

9. The device of claim 8 wherein the semiconductor is silicon.

10. The device of claim 1 wherein the semiconductor has Debye shielding lengths abutting said layers much greater than the thicknesses of the insulating layers.

11. A device for converting radiant energy into electric energy comprising a capacitor responsive to the radiant energy, said capacitor comprising a layer of an intrinsic semiconductor, an insulating layer on the semiconductor layer, a pair of contacts for said capacitor, said contacts, insulating layer and semiconductor layer being such that no junction barrier layer exists between the contacts; means responsive to the radiant energy for heating the semiconductor to modulate the capacitance between the contacts, and means for connecting a load to be responsive to current derived from the capacitor in response to the capacitance modulation.

12. The device of claim 11 further including means for initially applying a voltage between said contacts so that an electric field is established across said insulating layer and a depletion layer is established in said semiconductor layer in proximity to a surface of the semiconductor layer abutting the insulating layer.

13. A device for converting radiant energy into electric energy comprising a capacitor responsive to the radiant energy, said capacitor comprising a layer of an effectively intrinsic semiconductor, first and second insulating layers on the semiconductor layer, first and second metallic contacts respectively on the first and second insulating layers, said contacts, semiconductor layer and insulating layers being such that no junction barrier exists between the contacts; means responsive to the radiant energy for heating the semiconductor to modulate the capacitance between the contacts, and means for connecting a load to be responsive to current derived from the capacitor in response to the capacitance modulation.

14. The device of claim 13 wherein the layer is formed of a semiconductor doped with deep donors or acceptors to a concentration of approximately $10^{17}$ to $10^{18}$ per cm$^3$.

15. The device of claim 13 wherein the layer is formed of a semiconductor doped with shallow donors or acceptors to a concentration of approximately $10^{13}$ to $10^{14}$ per cm$^3$.

16. The device of claim 13 wherein the layer is formed of a semiconductor doped with a concentration of charged carriers so that the resistance, R, and capacitance, C, thereof vary with temperature, T, in accordance with:

$$C = C_o e^{-E_c/kT} \quad (1)$$

$$R = R_o e^{E_r/kT} \quad (2)$$

where:
$C_o$ = static capacitance of the capacitor at high temperature, i.e., $kT >> E$,
$R_o$ = the static, series resistance of the capacitance at high temperature, i.e., $kT >> E$,
$E_c$ = the activation energy for the temperature dependent capacitance of the capacitor,
$E_r$ = the activation energy of the temperature dependent resistance of the capacitor,
k = Boltzmann's constant, and
T = temperature in degrees Kelvin.

17. The device of claim 13 wherein the semiconductor is doped with a concentration of donors or acceptors so that the doped charged carrier concentration is much greater than the intrinsic charged carrier concentration.

18. The device of claim 17 further including means for initially applying a voltage between said contacts so that electric fields are established across said insulating layers and depletion layers are established in said semiconductor layer in proximity to surfaces of the semiconductor layer abutting the insulating layers.

19. The device of claim 17 wherein the depletion layers have combined thicknesses less than the thickness of the semiconductor layer.

20. The device of claim 13 further including means for initially applying a voltage between said contacts so that electric fields are established across said insulating layers and depletion layers are established in said semiconductor layer in proximity to surfaces of the semiconductor layer abutting the insulating layers.

21. The apparatus of claim 13 further including a layer for absorbing the radiant energy, said layer being on an exterior surface of one of the contacts.

22. The device of claim 13 wherein the insulating layers are oxides of the semiconductor.

23. The device of claim 13 wherein the semiconductor has Debye lengths abutting said layers much greater than the thicknesses of the insulating layers.

24. A device for converting radiant energy into electric energy comprising a capacitor responsive to the radiant energy, said capacitor comprising a layer of an effectively intrinsic semiconductor, an insulating layer on the semiconductor layer, a pair of contacts for said capacitor, said contacts, insulating layer and semiconductor layer being such that no junction barrier layer exists between the contacts; means responsive to the radiant energy for heating the semiconductor to modulate the capacitance between the contacts, and means for connecting a load to be responsive to current derived from the capacitor in response to the capacitance modulation.

25. The device of claim 24 wherein the layer is formed of a semiconductor doped with deep donors or acceptors to a concentration of approximately $10^{17}$ to $10^{18}$ per cm$^3$.

26. The device of claim 24 wherein the layer is formed of a semiconductor doped with shallow donors or acceptors to a concentration of approximately $10^{13}$ to $10^{14}$ per cm$^3$.

27. The device of claim 24 wherein the layer is formed of a semiconductor doped with a concentration of charged carriers so that the resistance, R, and capacitance, C, thereof vary with temperature, T, in accordance with:

$$C = C_o e^{-E_c/kT} \quad (1)$$

$$R = R_o e^{E_r/kT} \quad (2)$$

where:
$C_o$ = static capacitance of the capacitor at high temperature, i.e., $kT >> E$,
$R_o$ = the static, series resistance of the capacitance at high temperature, i.e., $kT >> E$,
$E_c$ = the activation energy for the temperature dependent capacitance of the capacitor,
$E_r$ = the activation energy of the temperature dependent resistance of the capacitor,
k = Boltzmann's constant, and T = temperature in degress Kelvin.

28. The device of claim 24 wherein the semiconductor is doped with a concentration of donors or acceptors so that the doped charged carrier concentration is much greater than the intrinsic charged carrier concentration.

29. The device of claim 24 further including means for initially applying a voltage between said contacts so that an electric field is established across said insulating layer and a depletion layer is established in said semiconductor layer in proximity to a surface of the semiconductor layer abutting the insulating layer.

30. The device of claim 29 wherein the depletion layer has a thickness less than the thickness of the semiconductor layer.

* * * * *